(12) United States Patent
Maatta (10) Patent No.: US 8,890,408 B2
(45) Date of Patent: Nov. 18, 2014

(54) METHOD AND APPARATUS FOR COUPLING AN ACTIVE DISPLAY PORTION AND SUBSTRATE

(71) Applicant: Nokia Corporation, Espoo (FI)

(72) Inventor: Esa-Sakari Maatta, Espoo (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 13/745,409

(22) Filed: Jan. 18, 2013

(65) Prior Publication Data

US 2014/0203703 A1 Jul. 24, 2014

(51) Int. Cl.
| | |
|---|---|
| *H01L 51/50* | (2006.01) |
| *H01L 51/52* | (2006.01) |
| *H05K 3/32* | (2006.01) |
| *H05K 1/11* | (2006.01) |
| *H01L 23/31* | (2006.01) |
| *H05B 33/02* | (2006.01) |
| *G02F 1/1333* | (2006.01) |

(52) U.S. Cl.
CPC .................. *H05K 1/118* (2013.01); *H05K 3/32* (2013.01); *G02F 2001/133388* (2013.01); *H01L 23/3218* (2013.01); *H01L 51/50* (2013.01); *H01L 23/3121* (2013.01); *H05B 33/02* (2013.01)
USPC ............ 313/506; 313/505; 313/509; 313/511

(58) Field of Classification Search
CPC ..... H01L 51/50; H01L 51/52; H01L 51/5203; H01L 51/5225; H01L 27/3276; H01L 27/3288; H01L 33/62; H01L 2224/16; H01L 21/02367; H01L 21/0248; H01L 21/02697; H01L 23/3128; H01L 23/3121; G02F 2001/133388; G09G 3/12
USPC ..................... 313/498–512; 315/169.1, 169.3
See application file for complete search history.

(56) References Cited

U.S. PATENT DOCUMENTS

| | | | |
|---|---|---|---|
| 7,301,171 B2 * | 11/2007 | Osame et al. .................... | 257/59 |
| 7,745,994 B2 | 6/2010 | Tada | |
| 8,436,958 B2 * | 5/2013 | Lee ................................. | 349/60 |

(Continued)

FOREIGN PATENT DOCUMENTS

EP      1185057      3/2002

OTHER PUBLICATIONS

"All About Display Drivers Sony Ericsson Mobile Phone", Dec. 9, 2008, 36 pages.

(Continued)

*Primary Examiner* — Nimeshkumar Patel
*Assistant Examiner* — Jose M Diaz
(74) *Attorney, Agent, or Firm* — Hollingsworth Davis, LLC (57) ABSTRACT

In accordance with an example embodiment of the present invention, an apparatus includes a substrate having a plurality of conductive traces terminating at a peripheral edge of the substrate. An active display portion is disposed on an upper surface of the substrate and electrically coupled to the conductive traces of the substrate. The peripheral edge of the substrate includes a protruding region that extends beyond a peripheral edge of the active display portion. A plurality of conductive bonding pads are affixed at the protruding region and coupled to the plurality of the conductive traces. A flexible circuit includes a plurality of conductors electrically coupled to the plurality of bonding pads at locations on or below a lower surface of the substrate.

17 Claims, 9 Drawing Sheets

(56) References Cited

U.S. PATENT DOCUMENTS

| | | | |
|---|---|---|---|
| 8,557,699 B2 * | 10/2013 | Tsurume et al. | 438/667 |
| 2004/0012731 A1 | 1/2004 | Ishiwa | |
| 2005/0243239 A1 | 11/2005 | Kondo et al. | |
| 2008/0165139 A1 | 7/2008 | Hotelling et al. | |
| 2008/0165158 A1 | 7/2008 | Hotelling et al. | |
| 2009/0262277 A1 | 10/2009 | Kim | |
| 2011/0001706 A1 | 1/2011 | Sanford et al. | |
| 2012/0274879 A1 * | 11/2012 | Jinbo et al. | 349/69 |
| 2012/0314383 A1 | 12/2012 | Oohira | |
| 2013/0027282 A1 * | 1/2013 | Kimura et al. | 345/80 |
| 2013/0092911 A1 * | 4/2013 | Yamazaki et al. | 257/40 |
| 2013/0105805 A1 * | 5/2013 | Yamazaki et al. | 257/59 |
| 2013/0299791 A1 * | 11/2013 | Hirakata et al. | 257/40 |
| 2013/0299822 A1 * | 11/2013 | Yamazaki et al. | 257/43 |

OTHER PUBLICATIONS

International Search Report and Written Opinion dated May 21, 2014 for PCT Application No. PCT/FI2013/051084, 12 pages.

* cited by examiner

METHOD AND APPARATUS FOR COUPLING AN ACTIVE DISPLAY PORTION AND SUBSTRATE

TECHNICAL FIELD

The present application relates generally to displays for electronic devices.

BACKGROUND

Personal mobile devices are increasingly popular with consumers. A wide variety of mobile devices are available on the market, with smartphones currently being among the most widely adopted mobile devices. The display for mobile devices is an important component which occupies an appreciable amount of device space. In many designs, the display is connected to driver electronics using a flexible circuit, which extends from the front of the display to the driver electronics located behind the display, requiring additional space to accommodate bending of the flexible circuit.

SUMMARY

Various aspects of examples of the invention are set out in the claims.

According to a first aspect of the present invention, an apparatus comprises a substrate comprising a plurality of conductive traces terminating at a peripheral edge of the substrate. An active display portion is disposed on an upper surface of the substrate and electrically coupled to the conductive traces of the substrate. The peripheral edge of the substrate comprises a protruding region that extends beyond a peripheral edge of the active display portion. A plurality of conductive bonding pads are affixed at the protruding region and coupled to the plurality of the conductive traces. A flexible circuit comprises a plurality of conductors electrically coupled to the plurality of bonding pads at locations on or below a lower surface of the substrate.

According to a second aspect of the present invention, an apparatus comprises a substrate comprising a plurality of conductive traces terminating at a peripheral edge of the substrate. An active display portion is disposed on an upper surface of the substrate and electrically coupled to the conductive traces of the substrate. The peripheral edge of the substrate comprises a protruding region that extends beyond a peripheral edge of the display module. A plurality of conductive bonding pads are affixed at the protruding region at locations on or below a plane defined by the lower surface of the substrate. The plurality of conductive bonding pads are coupled to the plurality of the conductive traces. A flexible circuit comprises a plurality of conductors coupled to the plurality of bonding pads at the locations on or below the plane defined by the lower surface of the substrate.

According to a third aspect of the present invention, a method involves providing an active display portion disposed on an upper surface of a flexible substrate and electrically coupled to conductive traces of the substrate, wherein a peripheral edge of the substrate comprises a protruding region that extends beyond a peripheral edge of the display module. The method also involves affixing a plurality of conductive bonding pads at the protruding region of the substrate, and coupling the conductive traces on the upper surface of the substrate with the bonding pads. The method further involves connecting a plurality of conductors of a flexible circuit to the plurality of bonding pads at locations on or below a lower surface of the substrate.

According to a fourth aspect of the present invention, an apparatus comprises an active display portion disposed on an upper surface of a substrate and electrically coupled to conductive traces of the substrate. A peripheral edge of the substrate comprises a protruding region that extends beyond a peripheral edge of the display module. The apparatus comprises means for connecting the conductive traces on the upper surface of the substrate to a connection location on or near a lower surface of the substrate. The apparatus further comprises means for coupling a plurality of conductors of a flexible circuit situated proximate the lower surface of the substrate to the conductive traces at the connection location.

BRIEF DESCRIPTION OF THE DRAWINGS

For a more complete understanding of example embodiments of the present invention, reference is now made to the following descriptions taken in connection with the accompanying drawings in which.

DETAILED DESCRIPTION

Example embodiments of the present invention and their potential advantages are understood by referring to FIGS. 1 through 13 of the drawings.

The present disclosure generally relates to displays for electronic devices. In the following description, various example displays are shown which are well-suited for use in mobile and other electronic devices, such as a cellular phone for example. It will be appreciated that the concepts described herein may be applied to a wide variety of devices, such as a tablet computer or other PDA, a navigation device, a media player, a gaming console, etc.

Figure 1:
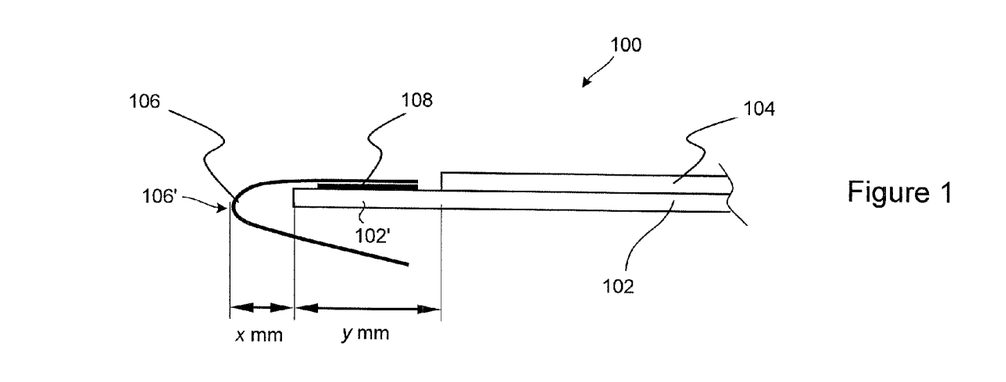
FIGS. 1 and 2 illustrate a display apparatus which includes an active display portion mounted on a substrate and a flexible circuit mounted to an upper surface of the substrate and extending around and below the substrate.
Figure 2:
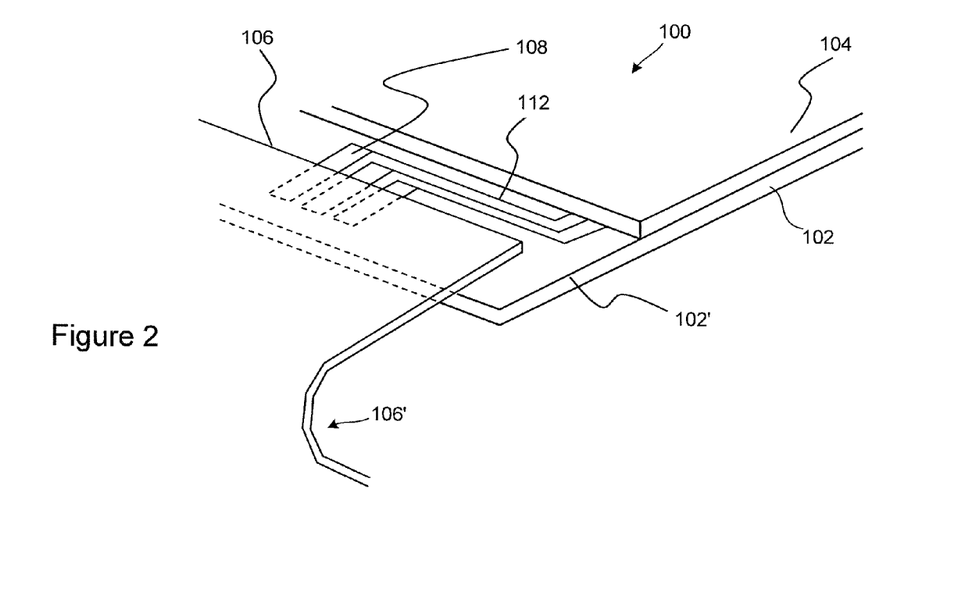

FIG. 1 illustrates a display apparatus 100 which includes an active display portion 104 mounted on a substrate 102. As best seen in FIG. 2, the substrate 102 includes a number of conductive traces 112 which connect to corresponding conductors of the active display portion 104 and terminate near and extended edge 102' of the substrate 102. The area of the extended edge 102' must be sufficient to accommodate a number of bonding pads 108, each of which is electrically connected to one of the conductive traces 112 of the substrate 102. The area of the extended edge 102' must also be sufficient to accommodate one end of a flexible circuit 106 which is connected to the bonding pads 108. The flexible circuit 106 includes a number of spaced-apart wires which terminate at a corresponding one of the bonding pads 108. The flexible circuit 106 is sufficiently resilient to bend around a side of the extended edge 102' to allow for connection with driver electronics (not shown) at the back of the substrate 102.

The space allocated to accommodate the bonding pads 108 and a portion of the flexible circuit 106 is referred to herein as "dead band." In general terms, the dead band represents the portion or portions of a display apparatus that are not part of the active area of the display. This dead band causes problems, such as complicating circuit board/component layout and antenna design, resulting in larger device housings and/or larger visual dead bands. Furthermore, the flexible circuit 106 may not be bent very sharply because this may cause excessive tension forces in the flexible circuit 106, which can break the bonding. The relatively large bending radius needed for the flexible circuit 106 increases dead band. In the context of the display apparatus shown in FIG. 1, for example, the dead band of the active display portion 104/substrate 102 is shown as the combination of the length (y mm) of the extended edge 102' of the substrate 102 that projects beyond the active area of the active display portion 104 and the space (x mm) allocated to accommodate the bend 106' of the flexible circuit 106 around the side of the extended edge 102'. For the display configuration shown in FIGS. 1 and 2, for example, the additional length (y mm) of the substrate 102 required for the bonding pad/flexible circuit interface, shown as the extended edge 102', is between about 5 and 6 mm. The additional amount of space (x mm) required to accommodate the bend 106' of the flexible circuit 106 is about 2 mm. Accordingly, the dead band for the display apparatus 100 shown in FIGS. 1 and 2 is between about 7 and 8 mm. Although the dead band is not considered part of the display's active area, the housing of the device which incorporates the display must be enlarged to accommodate the dead band portion of the display apparatus.

Figure 3:
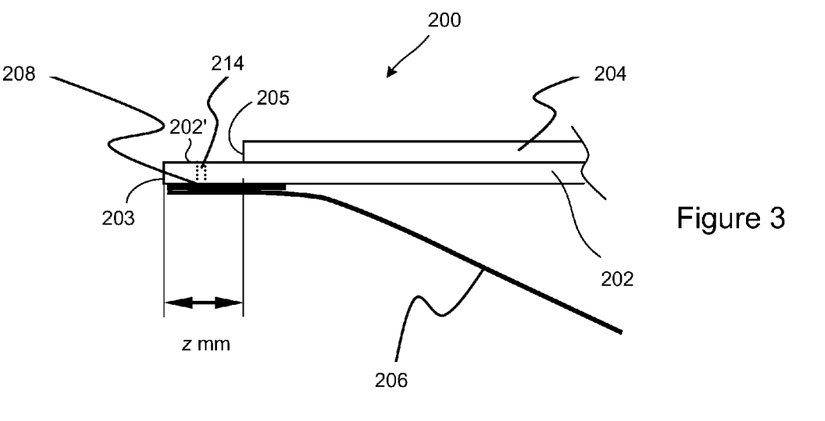
FIGS. 3 and 4 illustrate a display apparatus having a reduced dead band in accordance with an example embodiment of the present invention.
Figure 4:
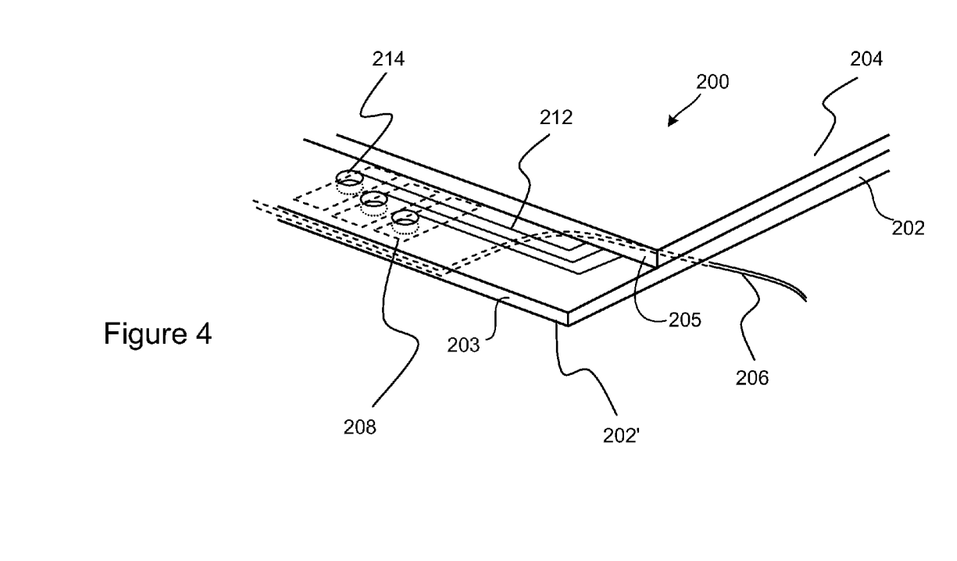

FIGS. 3 and 4 illustrate a display apparatus 200 having a reduced dead band in accordance with an example embodiment of the present invention. In the example embodiment shown in FIGS. 3 and 4, the display apparatus 200 includes a substrate 202 comprising a multiplicity of conductive traces 212 that terminate at a peripheral edge 203 of the substrate 202. The substrate 202 may be flexible or rigid. An active display portion 204 is disposed on an upper surface of the substrate 202, and is electrically coupled to the conductive traces 212 of the substrate 202. The active display portion 204 includes an active area, such as a liquid crystal display (LCD) or an organic LCD (OLED). The active display portion 204 may incorporate a touch screen, such as a capacitive, resistive, or force-based touch screen.

The peripheral edge 203 of the substrate 202 comprises a protruding region 202' that extends beyond a peripheral edge 205 of the active display portion 204. A multiplicity of bonding pads 208 are affixed at the protruding region 202' and electrically coupled to the multiplicity of conductive traces 212. A flexible circuit 206 comprises a multiplicity of conductors which are electrically coupled to the multiplicity of bonding pads 208 at the backside of the substrate 202. In the example embodiment shown in FIGS. 3 and 4, the substrate 202 comprises a multiplicity of vertical electrical connections or vias 214, which electrically couple the conductors of the flexible circuit 206 with the bonding pads 208 provided on the backside of the substrate 202.

According to the example embodiment shown in FIGS. 3 and 4, the entire flexible circuit 206 is situated on or below a lower surface of the substrate 202 and orientated inward rather than outward as in the configuration shown in FIGS. 1 and 2. It can be seen in FIGS. 3 and 4 that the bonding pads 208 are affixed at the protruding region 202' at locations on or below a plane defined by the lower surface of the substrate 202, and the conductors of the flexible circuit 206 are coupled to the bonding pads 208 at the locations on or below the plane defined by the lower surface of the substrate 202. The example display implementation illustrated in FIGS. 3 and 4 effectively transposes the bonding pad/flexible circuit interface from the upper surface of the substrate 202 to the lower surface or backside of the substrate 202.

Moving the bonding pads 208 to the backside of the substrate 202/display module 204 eliminates the bend (see bend 106' in FIG. 1) in the flexible circuit 206, and also eliminates the dead band space (e.g., x mm shown in FIG. 1) allocated to accommodate the flexible circuit bend. By moving the bonding pads 208 to the backside of the substrate 202/display module 204, the size of the protruding region 202' of the substrate 202 can be significantly reduced (e.g., by up to about 50 to 70%), which results in a further reduction in the size of the dead band. For example, the dead band of between about 7-8 mm shown in FIG. 1 is reduced to about 3 mm in the example embodiment shown in FIGS. 3 and 4. This significant reduction in the dead band of the display apparatus 200 results in a concomitant reduction in the size of the device housing within which the display apparatus 200 is incorporated (e.g., a total reduction of the dead band in an electronic device, such as a mobile phone, of about 4-5 mm).

According to example embodiments, the bonding pads 208 are configured to make electrical and mechanical connections with the conductive traces 212 provided on the substrate 202 and with the conductors of the flexible circuit 206. The bonding pads 208 include an adhesive, such as a conductive epoxy or acryl, which bonds the conductors of the flexible circuit 206 to the substrate 202 and traces 212. In some example embodiments, the bonding pads 208 comprise an anisotropic conductive adhesive (ACA), such as anisotropic conductive film (ACF).

Figure 5:
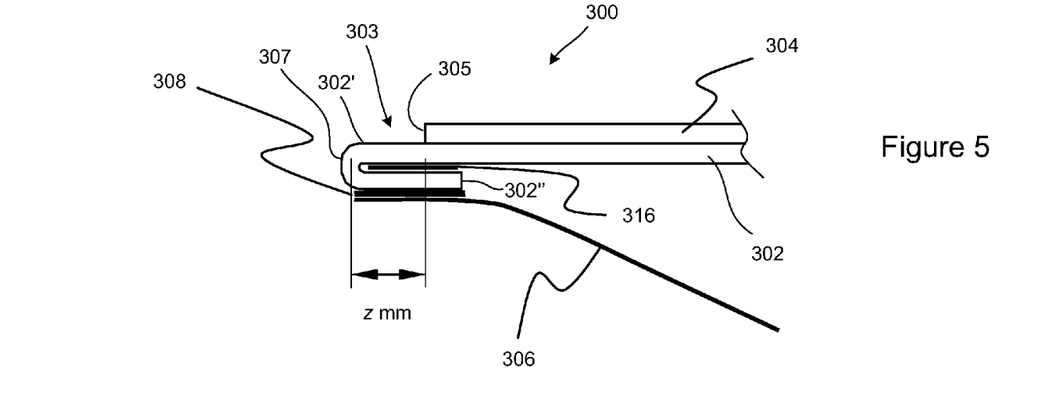
FIGS. 5 and 6 illustrate a display apparatus having a reduced dead band in accordance with another example embodiment of the present invention.
Figure 6:
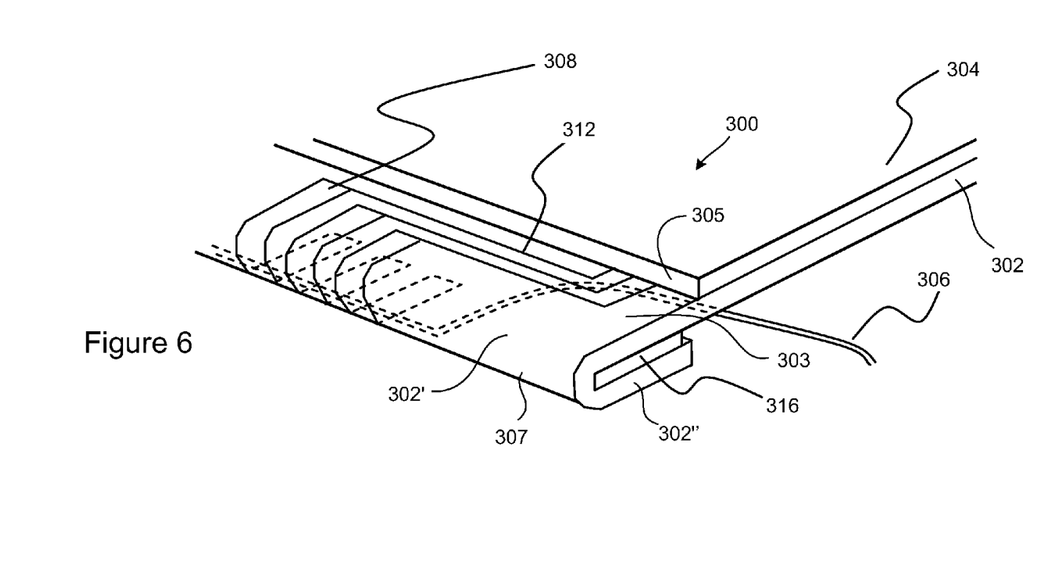

FIGS. 5 and 6 illustrate a display apparatus 300 having a reduced dead band in accordance with an example embodiment of the present invention. In the example embodiment shown in FIGS. 5 and 6, the display apparatus 300 includes a flexible substrate 302 comprising a multiplicity of conductive traces 312 that terminate at a peripheral edge 303 of the substrate 302. An active display portion 304 is disposed on an upper surface of the substrate 302, and is electrically coupled to the conductive traces 312 of the substrate 302. The peripheral edge 303 of the substrate 302 comprises a protruding region 302' that extends beyond a peripheral edge 305 of the active display portion 304 and folds back onto itself. The folded-back portion 302" of the protruding region 302' is secured in place by an adhesive 316. A multiplicity of bonding pads 308 are affixed at the protruding region 302' and electrically coupled to the multiplicity of conductive traces 312. In the example embodiment shown in FIGS. 5 and 6, the bonding pads 308 extend from the conductive traces 312 on the upper surface of the substrate 302, curve around the bend 307 of the protruding region 302', and extend along the folded-back portion 302". The conductors of a flexible circuit 306 are electrically coupled to the multiplicity of bonding pads 308 at the folded-back region 302" of the flexible substrate 302.

In the example embodiment shown in FIGS. 5 and 6, the entire flexible circuit 306 is situated on or below a lower surface of the flexible substrate 302. It can be seen in FIGS. 5 and 6 that the bonding pads 308 are affixed at the protruding region 302' at locations on or below a plane defined by the lower surface of the substrate 302 (prior to the bend 307), and the conductors of the flexible circuit 306 are coupled to the bonding pads 308 at the locations on or below the plane defined by the lower surface of the substrate 302. Moving the bonding pads 308 to the backside of the substrate 302/display module 304 eliminates the bend in the flexible circuit 306, eliminates the dead band space allocated to accommodate the flexible circuit bend, eliminates tension at bonding area of the flexible circuit, and provides for a reduction in the size of the laterally projecting portion of the protruding region 302' of the substrate 302 (e.g., by up to about 50 to 70%), which results in a further reduction in the size of the dead band. For example, the dead band of between about 7-8 mm shown in FIG. 1 is reduced to about 3 mm in the example embodiment shown in FIGS. 5 and 6. This significant reduction in the dead band of the display apparatus 300 results in a concomitant reduction in the size of the device housing within which the display apparatus 300 is incorporated.

Figure 7:
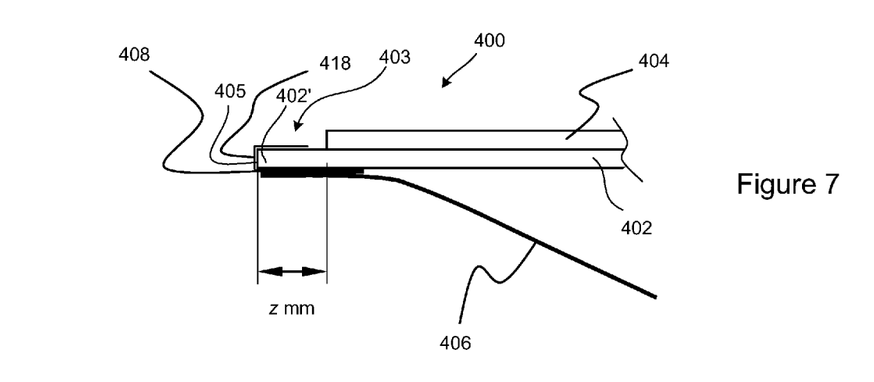
FIGS. 7-9 illustrate a display apparatus having a reduced dead band in accordance with a further example embodiment of the present invention.
Figure 8:
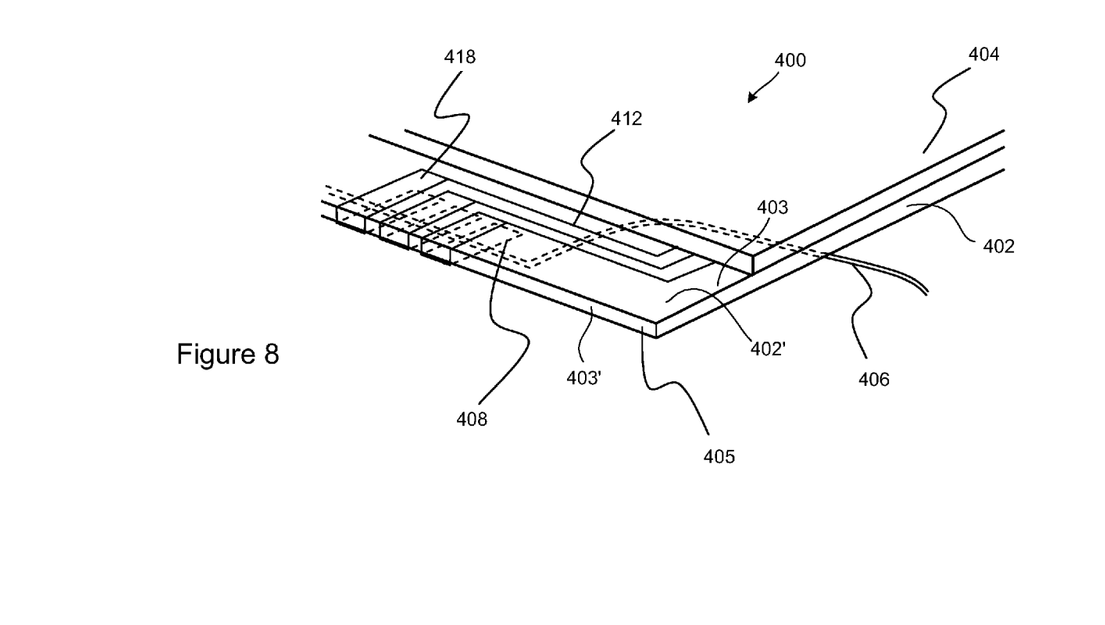
Figure 9:
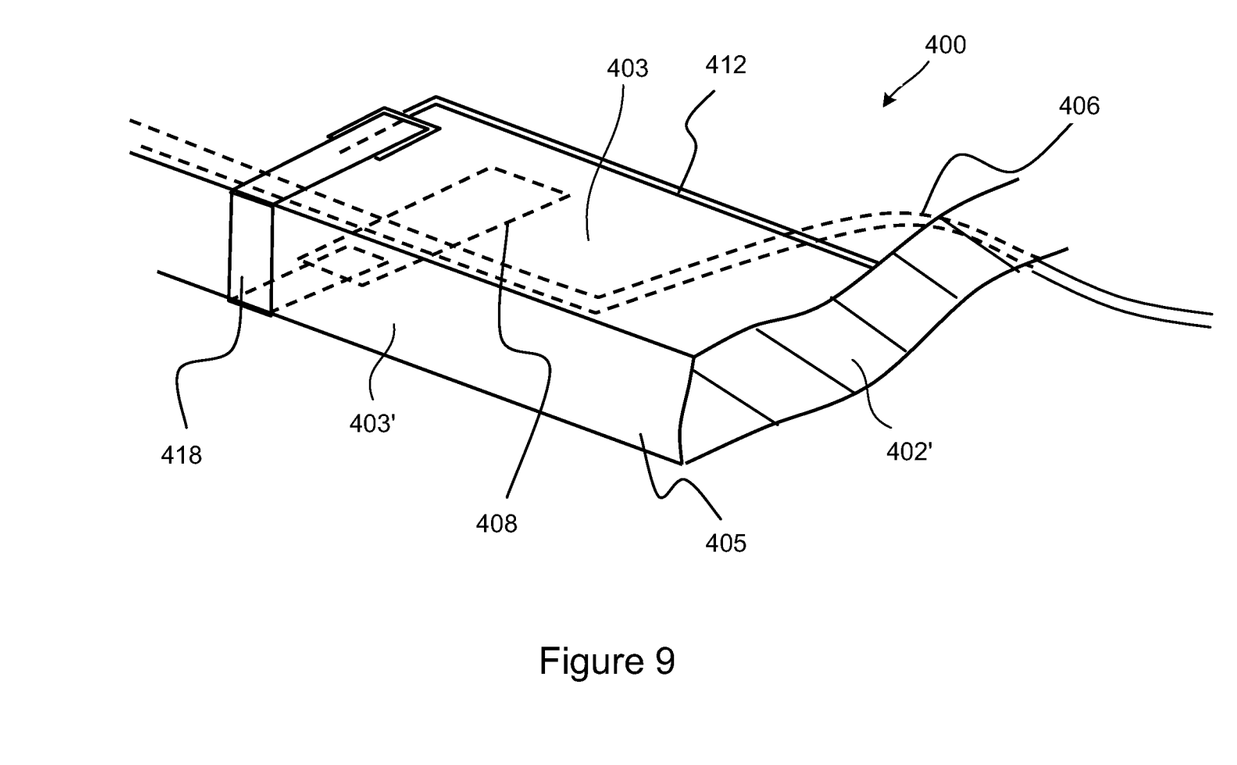

FIGS. 7-9 illustrate a display apparatus 400 having a reduced dead band in accordance with an example embodiment of the present invention. In the example embodiment shown in FIGS. 7-9, the display apparatus 400 includes a configuration suitable for a rigid substrate 402, e.g., a glass substrate. A glass substrate would be difficult to fold over as in FIGS. 5-6 and it may be difficult to create vias on a glass substrate. The substrate 402 comprises a multiplicity of conductive traces 412 that terminate at a peripheral edge 403 of the substrate 402. An active display portion 404 is disposed on an upper surface of the substrate 402, and is electrically coupled to the conductive traces 412 of the substrate 402. The peripheral edge 403 of the substrate 402 comprises a protruding region 402' that extends beyond a peripheral edge 405 of the active display portion 404. A multiplicity of bonding pads 408 are provided on a lower surface of the substrate 402 at the protruding region 402'. In the example embodiment shown in FIGS. 7-9, printed conductors 418 extend from the conductive traces 412 on the upper surface of the substrate 402, over a side 403' of the protruding region 402', along a portion of the lower surface of the protruding region 402', and terminate at the bonding pads 408. According to an example embodiment, the printed conductors 418 comprise printed silver ink conductors. The conductors of a flexible circuit 406 are coupled to the bonding pads 408 on the lower surface of the protruding region 402' of the substrate 402.

In the example embodiment shown in FIGS. 7-9, the entire flexible circuit 406 is situated on or below a lower surface of the substrate 402. It can be seen in FIGS. 7-9 that the bonding pads 408 are affixed at the protruding region 402' at locations on or below a plane defined by the lower surface of the substrate 402, and the conductors of the flexible circuit 406 are coupled to the bonding pads 408 at the locations on or below the plane defined by the lower surface of the substrate 402. Moving the bonding pads 408 to the backside of the substrate 402/display module 404 eliminates the bend in the flexible circuit 406, eliminates the dead band space allocated to accommodate the flexible circuit bend, and provides for a reduction in the size of the protruding region 402' of the substrate 402 (e.g., by up to about 50 to 70%), which results in a further reduction in the size of the dead band. For example, the dead band of between about 7-8 mm shown in FIG. 1 is reduced to about 3 mm in the example embodiment shown in FIGS. 7-9. This significant reduction in the dead band of the display apparatus 400 results in a concomitant reduction in the size of the device housing within which the display apparatus 400 is incorporated.

Figure 10:
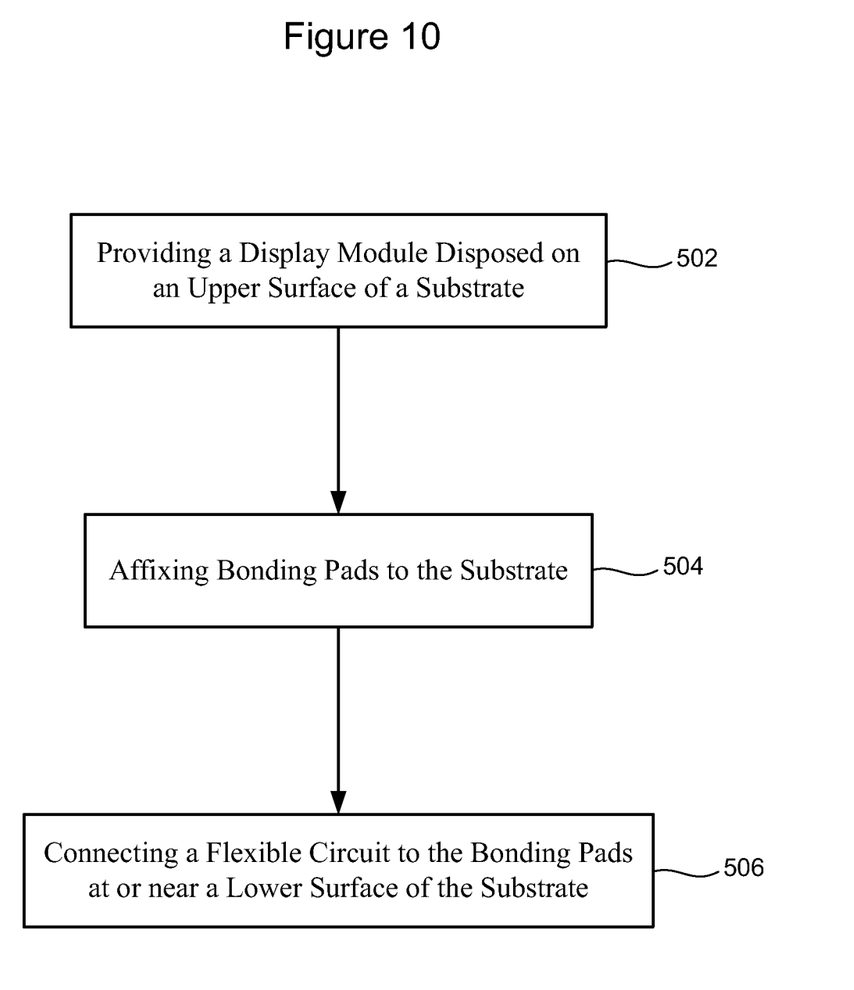
FIG. 10 illustrates a method of fabricating a display apparatus having a reduced dead band in accordance with an example embodiment of the present invention.

FIG. 10 illustrates a method of fabricating a display apparatus having a reduced dead band in accordance with an example embodiment of the present invention. The example method shown in FIG. 10 involves providing 502 an active display portion disposed on an upper surface of the substrate, and affixing 504 bonding pads to the substrate. The example method shown in FIG. 10 further involves connecting 506 a flexible circuit to the bonding pads at or near a lower surface of the substrate. The example method illustrated in FIG. 10 effectively transposes the bonding pad/flexible circuit interface from the upper surface of the substrate to the lower or backside of the substrate, which eliminates the bend in the flexible circuit, eliminates the dead band space allocated to accommodate the flexible circuit bend, and reduces the overall size of the dead band of the display apparatus.

Figure 11:
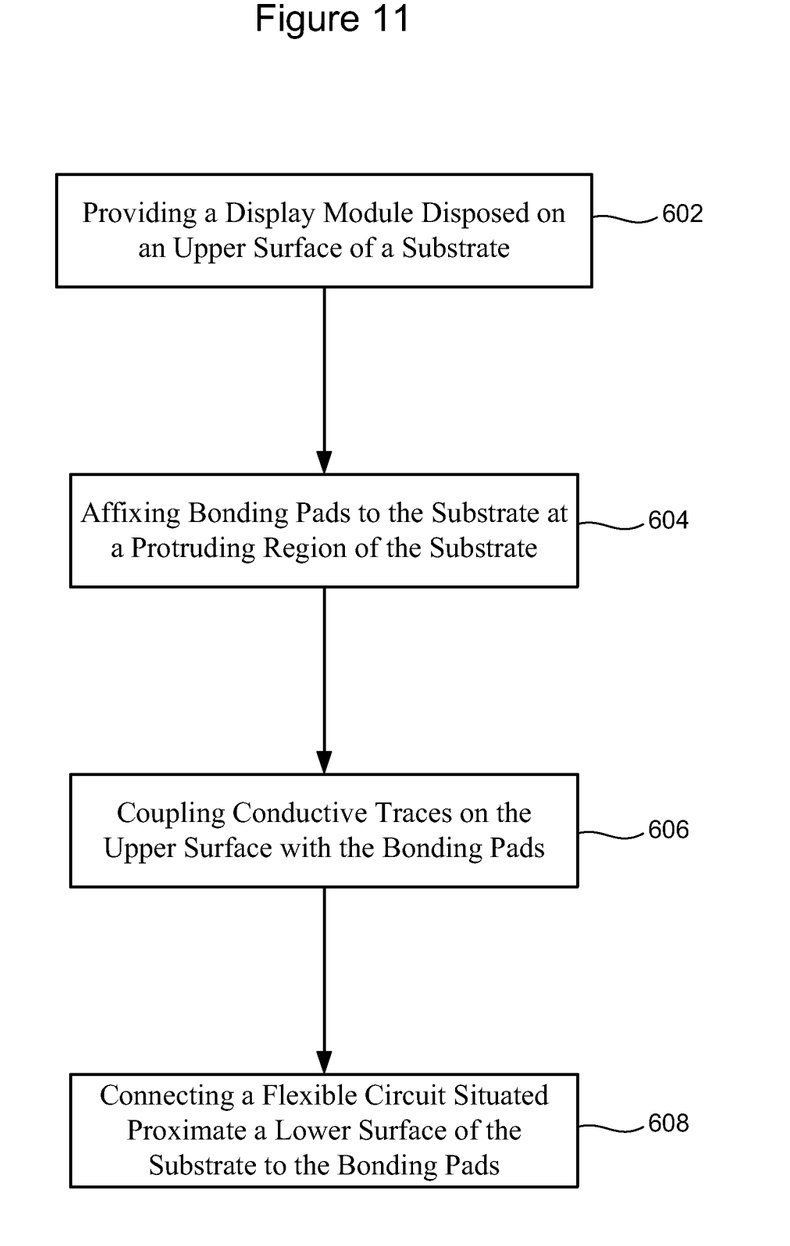
FIG. 11 illustrates a method of fabricating a display apparatus having a reduced dead band in accordance with another example embodiment of the present invention.

FIG. 11 illustrates a method of fabricating a display apparatus having a reduced dead band in accordance with an example embodiment of the present invention. The example method depicted in FIG. 11 involves providing 602 an active display portion disposed on an upper surface of the substrate. The example method shown in FIG. 11 also involves affixing 604 bonding pads to the substrate at a protruding region of the substrate, and coupling 606 conductive traces on the upper surface with the bonding pads. The example method illustrated in FIG. 11 further involves connecting 608 a flexible circuit situated proximate a lower surface of the substrate to the bonding pads. The example method illustrated in FIG. 11 effectively transposes the bonding pad/flexible circuit interface from the upper surface of the substrate to the lower or backside of the substrate, which eliminates the bend in the flexible circuit, eliminates the dead band space allocated to accommodate the flexible circuit bend, and reduces the overall size of the dead band of the display apparatus.

According to example embodiments, the methods illustrated in FIGS. 10 and 11 further involve affixing the bonding pads to the lower surface of the substrate at the protruding region, and forming conductive vias through the substrate at the protruding region, such that the vias couple the conductive traces with the bonding pads. In other example embodiments, the methods illustrated in FIGS. 10 and 11 further involve affixing the bonding pads to the lower surface of the substrate at the protruding region, and printing electrical conductors that extend from the conductive traces, along a side of the peripheral edge of the substrate, and to the bonding pads. In further example embodiments, the methods illustrated in FIGS. 10 and 11 further involve affixing the bonding pads to the upper surface of the substrate at the protruding region, folding a portion of the protruding region that includes the bonding pads on itself, and connecting flexible circuit conductors to the bonding pads at the folded portion of the protruding region.

In accordance with an example embodiment, affixing bonding pads to the substrate involves laminating ACF of appropriate dimensions to the substrate. Laminating the ACF involves applying a force to the AFC for a predetermined duration and at an elevated temperature, such as by use of a bondhead. The ACF has a release liner on its rear surface to prevent the bondhead from adhering to the ACF during the lamination procedure. The release liner is removed upon completion of the lamination procedure. The distal ends of the conductors of the flexible circuit are aligned with corresponding bonding pads by looking through the ACF, and then lightly tacked in place either with low heat or no heat under light pressure. The final process involves subjecting the ACF to relatively high heat and pressure, thereby permanently curing the epoxy and attaching the conductors of the flexible circuit to the substrate of the display apparatus. It will be understood that various ACF materials may have different processing parameters, and selection of the appropriate parameters is well within the knowledge of one of ordinary skill in the art. In case of a plastic display, ACF might not be used due to heat and pressure at active portion of the display apparatus. In such a case, conductive glue may be used.

Figure 12:
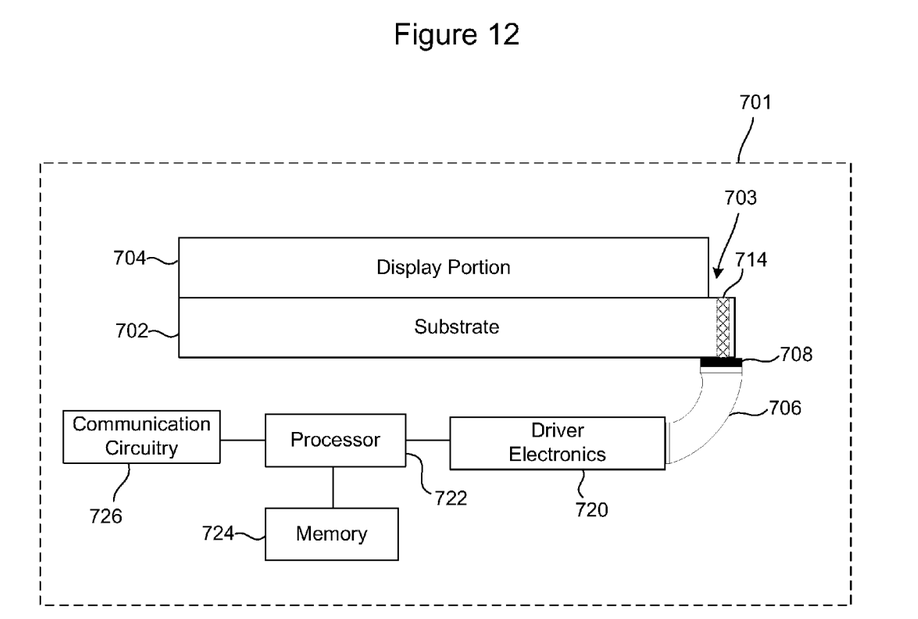
FIG. 12 illustrates a representative electronic device which incorporates a display apparatus having a reduced dead band in accordance with an example embodiment of the present invention.

FIG. 12 illustrates a representative electronic device 701 which incorporates a display apparatus having a reduced dead band in accordance with an example embodiment of the present invention. The example embodiment of the electronic device 701 includes an active display portion 704 disposed on an upper surface of a substrate 702. The substrate 702 comprises conductive traces that terminate at a protruding peripheral edge 703 of the substrate 702. The substrate 702 may be flexible or rigid. The active display portion 704 includes connectors which electrically couple with the conductive traces of the substrate 702. A flexible circuit 706 is situated at the backside of the substrate 702. The distal ends of the conductors at one end of the flexible circuit 706 are electrically and mechanically coupled to bonding pads 708 affixed to the lower surface of the substrate 702 at the protruding peripheral edge 703. In the example embodiment shown in FIG. 12, conductive vias 714 at the protruding peripheral edge 703 of the substrate 702 electrically couple each of the conductive traces with a respective bonding pad 708 and conductor of the flexible circuit 706. It is understood that the connection configurations shown in FIGS. 5-6 and 7-9 can be used in lieu of the conductive vias 714.

The example electronic device 701 further includes driver electronics 720 coupled to a processor 722. The processor 722, which can be a single core, double-core, or other multi-core processor, is coupled to memory 724 and to communication circuitry 726. The memory 724 stores operating software and, if applicable, one or more apps which can be executed by a user. The communication circuitry 726 includes one or more communication interfaces, such as one or more wireless interfaces (e.g., cellular, Bluetooth, Wi-Fi) and/or wired interfaces (e.g., USB, FIREWIRE, Ethernet). The driver electronics 720 are coupled to the other end of the flexible circuit 706.

Figure 13:
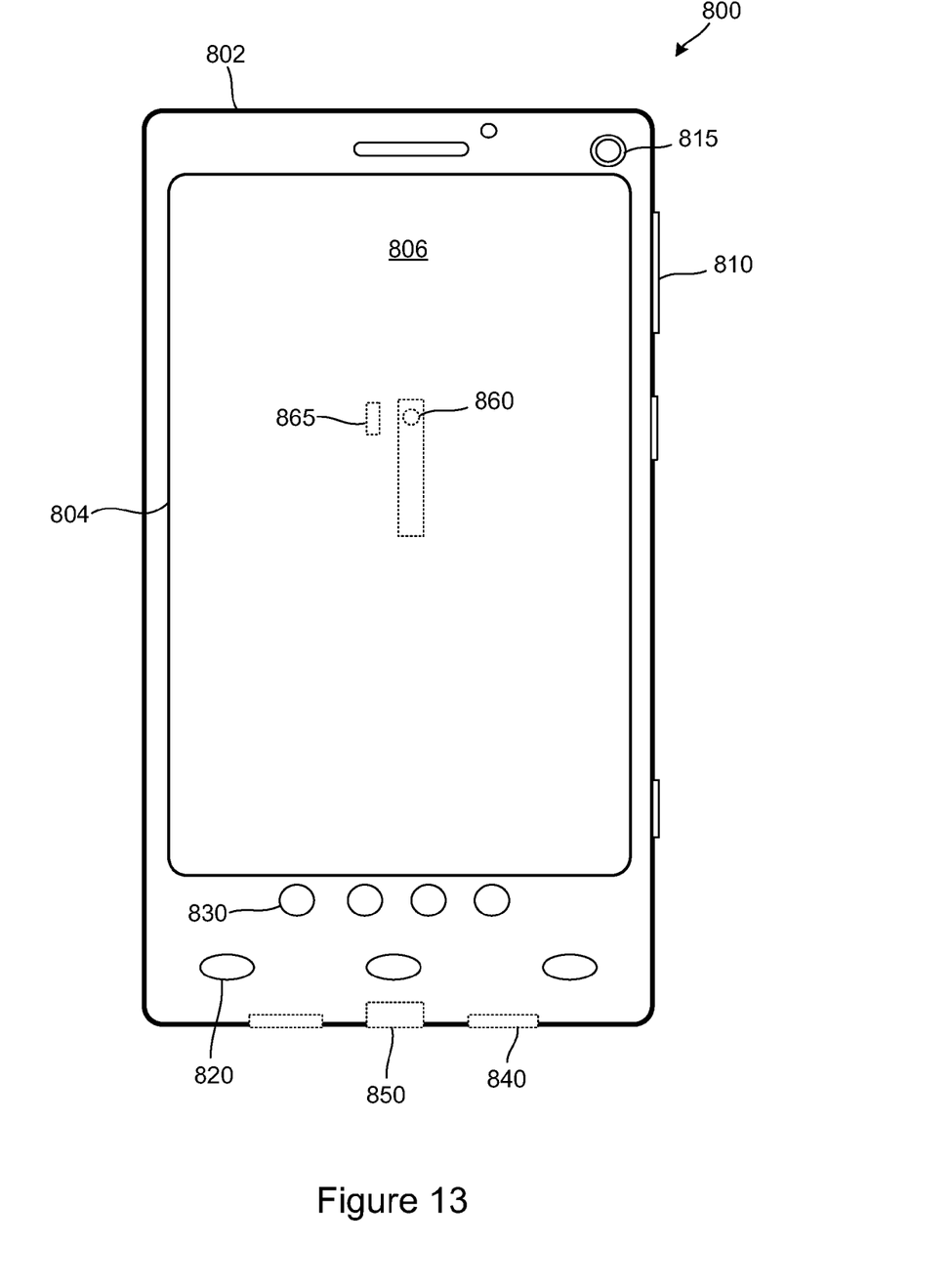
FIG. 13 illustrates a representative electronic device which incorporates a display apparatus having a reduced dead band in accordance with another example embodiment of the present invention.

FIG. 13 illustrates a representative electronic device which incorporates a display apparatus having a reduced dead band in accordance with an example embodiment of the present invention. The example electronic device 800 shown in FIG. 13 comprises a hand-held housing 802 within which various components are housed or supported. A display 804 having a configuration described hereinabove is provided on an upper surface of the electronic device 800. In some configurations, the display 804 is implemented as a display device, such as a liquid crystal display. In other embodiments, the display 804 is implemented as a touch screen, which facilitates tactile interaction with software, applications and other functions supported by the electronic device 800. In other embodiments, the display 804 may be implemented as a hovering sensing display which detects an input, such as a finger, pen or stylus, above the display.

According to various example embodiments, the upper surface of the electronic device 800 comprises a number of soft key buttons 830 and hard key buttons 820 for invoking specified functions or sets of functions. One or more manually actuatable switches 810 are provided along one or more sides of the housing 802 which allow user control of specified functions, such as changing the volume of speakers 840 and turning on and off device power. The housing 802 incorporates an input/output interface connector 850, such as a USB connector. In some embodiments, the electronic device 800 incorporates a first camera 860 (shown in phantom) provided on a lower surface of the housing 802. A flash assembly 865 is provided on the lower surface of the housing 802 proximate the first camera 860. A second camera 815 is optionally provided on the upper surface of the housing 802. According to some embodiments, the electronic device 800 may comprise one or more radios, such as a cellular radio, a Wi-Fi radio, a Bluetooth radio, or other radio technology.

Although various aspects of the invention are set out in the independent claims, other aspects of the invention comprise other combinations of features from the described embodiments and/or the dependent claims with the features of the independent claims, and not solely the combinations explicitly set out in the claims.

It is also noted herein that while the above describes example embodiments of the invention, these descriptions should not be viewed in a limiting sense. Rather, there are several variations and modifications which may be made without departing from the scope of the present invention as defined in the appended claims.

What is claimed is:

1. An apparatus, comprising:
    a substrate comprising a plurality of conductive traces terminating at a peripheral edge of the substrate;
    an active display portion disposed on an upper surface of the substrate and electrically coupled to the conductive traces of the substrate, the peripheral edge of the substrate comprising a protruding region that extends beyond a peripheral edge of the active display portion and folds back on itself;
    a plurality of conductive bonding pads affixed at a folded-back portion of the protruding region and coupled to the plurality of the conductive traces, and
    a flexible circuit comprising a plurality of conductors electrically coupled and affixed to the plurality of bonding pads at the folded-back portion of the protruding region on or below a lower surface of the substrate.

2. The apparatus of claim 1, wherein the plurality of bonding pads are affixed to the lower surface of the substrate.

3. The apparatus of claim 1, wherein:
    the plurality of bonding pads are affixed to the lower surface of the substrate;
    the substrate further comprises a plurality of conductive vias coupled to the plurality of conductive traces; and
    the plurality of conductors of the flexible circuit are electrically coupled to the plurality of vias.

4. The apparatus of claim 1, wherein:
    the plurality of bonding pads are affixed to the lower surface of the substrate; and
    a plurality of printed conductors are provided on the upper surface of the substrate and extend between the plurality of conductive traces and the plurality of bonding pads.

5. The apparatus of claim 1, wherein the bonding pads comprise anisotropic conductive film.

6. The apparatus of claim 1, wherein the active display portion comprises an OLED display.

7. A mobile electronic device comprising the apparatus of claim 1.

8. An apparatus, comprising:
    a substrate comprising an upper surface, a lower surface, and a plurality of conductive traces terminating at a peripheral edge of the substrate;
    an active display portion disposed on the upper surface of the substrate and electrically coupled to the conductive traces of the substrate, the peripheral edge of the substrate comprising a protruding region that extends beyond a peripheral edge of the active display portion and folds back on itself;

a plurality of conductive bonding pads affixed at a folded-back portion of the protruding region at locations on or below a plane defined by the lower surface of the substrate, the plurality of conductive bonding pads coupled to the plurality of the conductive traces; and a flexible circuit comprising a plurality of conductors coupled to the plurality of bonding pads at the folded-back portion of the protruding region on or below the plane defined by the lower surface of the substrate.

9. The apparatus of claim 8, wherein no portion of the flexible circuit extends above the plane defined by the lower surface of the substrate.

10. The apparatus of claim 8, wherein the plurality of bonding pads are affixed to the lower surface of the substrate.

11. The apparatus of claim 8, wherein:

the plurality of bonding pads are affixed to the lower surface of the substrate;

the substrate further comprises a plurality of conductive vias coupled to the plurality of conductive traces; and the plurality of conductors of the flexible circuit are coupled to the plurality of vias.

12. The apparatus of claim 8, wherein:

the plurality of bonding pads are affixed to the lower surface of the substrate; and a plurality of printed conductors are provided on the upper surface of the substrate and extend between the plurality of conductive traces and the plurality of bonding pads.

13. The apparatus of claim 8, wherein the bonding pads comprise anisotropic conductive film.

14. A mobile electronic device comprising the apparatus of claim 8.

15. A method, comprising:

providing an active display portion disposed on an upper surface of a substrate and electrically coupled to conductive traces of the substrate, a peripheral edge of the substrate comprising a protruding region that extends beyond a peripheral edge of the active display portion;

affixing a plurality of conductive bonding pads to a lower surface of the substrate at the protruding region of the substrate;

printing electrical conductors that extend from the conductive traces, along a side of the peripheral edge of the substrate, and to the bonding pads to couple the conductive traces on the upper surface of the substrate with the bonding pads; and connecting a plurality of conductors of a flexible circuit to the plurality of bonding pads at locations on or below the lower surface of the substrate.

16. The method of claim 15, wherein affixing the bonding pads comprises affixing the bonding pads to the lower surface of the substrate at the protruding region; and coupling the conductive traces with the bonding pads comprises forming conductive vias through the substrate at the protruding region, the vias coupling the conductive traces with the bonding pads.

17. The method of claim 15, wherein:

affixing the bonding pads comprises affixing the bonding pads to the upper surface of the substrate at the protruding region;

the method further comprises folding a portion of the protruding region that includes the bonding pads on itself; and connecting the plurality of the flexible circuit conductors comprises connecting the plurality of the flexible circuit conductors to the plurality of bonding pads at the folded portion of the protruding region.

* * * * *